US008558559B2

(12) United States Patent
Hashimoto

(10) Patent No.: US 8,558,559 B2
(45) Date of Patent: *Oct. 15, 2013

(54) TEST APPARATUS, ADDITIONAL CIRCUIT AND TEST BOARD FOR CALCULATING LOAD CURRENT OF A DEVICE UNDER TEST

(75) Inventor: Yoshihiro Hashimoto, Saitama (JP)

(73) Assignee: Advantest Corporation, Tokyo (JP)

( * ) Notice: Subject to any disclaimer, the term of this patent is extended or adjusted under 35 U.S.C. 154(b) by 479 days.

This patent is subject to a terminal disclaimer.

(21) Appl. No.: 12/876,052

(22) Filed: Sep. 3, 2010

(65) Prior Publication Data

US 2011/0169500 A1     Jul. 14, 2011

Related U.S. Application Data

(63) Continuation of application No. PCT/JP2010/001330, filed on Feb. 26, 2010, and a continuation-in-part of application No. PCT/JP2009/003482, filed on Jul. 23, 2009, and a continuation-in-part of application No. 12/603,350, filed on Oct. 21, 2009, now Pat. No. 8,164,351.

(51) Int. Cl.
G01R 27/26 (2006.01)
(52) U.S. Cl.
USPC ....... 324/678; 324/705; 324/713; 324/762.01
(58) Field of Classification Search
None
See application file for complete search history.

(56) References Cited

U.S. PATENT DOCUMENTS

| 5,789,934 | A | 8/1998 | Kolkowski et al. |
|---|---|---|---|
| 6,031,361 | A | 2/2000 | Burnstein et al. |
| 6,087,843 | A | 7/2000 | Pun et al. |
| 6,100,676 | A | 8/2000 | Burnstein et al. |
| 6,198,261 | B1 | 3/2001 | Schultz et al. |
| 6,268,716 | B1 | 7/2001 | Burnstein et al. |
| 6,323,668 | B1 | 11/2001 | Hashimoto |
| 6,556,034 | B1 | 4/2003 | Johnson et al. |
| 7,005,867 | B2 | 2/2006 | Hashimoto |
| 7,132,844 | B2 | 11/2006 | Hashimoto |
| 8,164,351 | B2 * | 4/2012 | Hashimoto ............ 324/678 |
| 2001/0017769 | A1 | 8/2001 | Ito |
| 2002/0135340 | A1 | 9/2002 | Hashimoto |
| 2008/0174318 | A1 | 7/2008 | Seki |
| 2009/0121725 | A1 | 5/2009 | Hashimoto |
| 2009/0121726 | A1 | 5/2009 | Hashimoto |
| 2011/0031984 | A1 * | 2/2011 | Hashimoto et al. ......... 324/678 |

FOREIGN PATENT DOCUMENTS

| JP | 7-209372 A | 8/1995 |
|---|---|---|
| JP | 7-248353 A | 9/1995 |
| JP | 10-293154 A | 11/1998 |
| JP | 11-23655 A | 1/1999 |

(Continued)

OTHER PUBLICATIONS

Korean Office Action dated Apr. 30, 2012 in a counterpart Korean patent application No. 10-2010-7020772.

(Continued)

Primary Examiner — Minh N Tang

(57) ABSTRACT

Provided is a test apparatus that measures charge/discharge current of an intermediate capacitor provided between a transmission path transmitting power from a power supply to a device under test and a ground potential, and calculates a load current flowing through a device under test, based on the charge/discharge current.

17 Claims, 10 Drawing Sheets

(56) References Cited

FOREIGN PATENT DOCUMENTS

| | | |
|---|---|---|
| JP | 2001-195139 A | 7/2001 |
| JP | 2001-251034 A | 9/2001 |
| JP | 2002-530036 A | 9/2002 |
| JP | 2003-14825 A | 1/2003 |
| JP | 2006-344740 A | 12/2006 |
| JP | 2009-74900 A | 4/2009 |
| JP | 2009-115794 A | 5/2009 |
| JP | 2009-121843 A | 6/2009 |
| WO | 2006/054435 A1 | 5/2006 |

OTHER PUBLICATIONS

Korean Office Action dated Apr. 30, 2012 in a counterpart Korean patent application No. 10-2010-7020773.
Korean Office Action dated Apr. 29, 2012 in a counterpart Korean patent application No. 10-2010-7020774.
Office Action, issued on Oct. 7, 2011 in related case, U.S. Appl. No. 12/603,350.
Applicant brings the attention of the Examiner to the following pending U.S. Appl. No. 12/502,946, filed Jul. 14, 2009, U.S. Appl. No. 12/876,057, filed Sep. 3, 2010 and U.S. Appl. No. 12/877,097, filed Sep. 7, 2010.
International Search Report (ISR) for PCT/JP2010/001330 (parent application) mailed in Apr. 2010 for Examiner consideration.
International Search Report (ISR) for PCT/JP2009/003482 (parent application) mailed in Oct. 2009 for Examiner consideration.
Written Opinion (PCT/ISA/237) issued in PCT/JP2010/001330 mailed in Apr. 2010.
Written Opinion (PCT/ISA/237) issued in PCT/JP20091003482 mailed in Oct. 2009.

* cited by examiner

TEST APPARATUS, ADDITIONAL CIRCUIT AND TEST BOARD FOR CALCULATING LOAD CURRENT OF A DEVICE UNDER TEST

This application is a continuation of U.S. Patent Application No. PCT/JP2010/001330, filed on Feb. 26, 2010, and is a continuation-in-part of U.S. patent application Ser. No. 12/603,350, filed on Oct. 21, 2009, now U.S. Pat. No. 8,164,351, which is a continuation of U.S. Patent Application No. PCT/JP2009/003482, filed Jul. 23, 2009 each of the foregoing applications hereby incorporated by reference in their entirety.

BACKGROUND

1. Technical Field

The present invention relates to a test apparatus, an additional circuit, and a test board.

2. Related Art

When testing a device under test such as a semiconductor circuit, a power supply apparatus that supplies current to the device under test sometimes cannot quickly follow fluctuation in the current consumed by the device under test. A known technique for solving this problem, as shown in Patent Document 1, involves providing a bypass capacitor to the power supply line near the device under test.

Patent Document 1: Japanese Patent Application Publication No. 2001-195139

Patent Document 2: U.S. Pat. No. 6,087,843

A bypass capacitor is provided that has a large capacitance, e.g. tens of μF, capable of following a large fluctuation in the power supply current. In order to measure a low current, such as standby current, it is necessary to measure a low output current of the power supply apparatus. In this case, there is a limit on the load capacitance connected to the power supply apparatus, and so a lead relay is provided to disconnect a high-capacitance bypass capacitor from the power supply line.

However, since there are structural limitations near the device under test, a lead relay cannot be provided there. As a result, the high-capacitance bypass capacitor cannot be provided near the device under test, and is instead provided at a distance from the device under test.

Therefore, the power supply line from the bypass capacitor to the device under test is lengthened, which increases the inductance component between the bypass capacitor and the device under test. As a result, it becomes difficult to supply high-frequency current from the bypass capacitor to the device under test.

One test that can be performed for the device under test involves measuring the current consumed when the device under test operates. This test involves measuring the current consumed by the device under test by measuring the current flowing through the power supply line. More specifically, this test involves measuring the current consumed by the device under test by measuring the current flowing through the power supply line on the device under test side of the bypass capacitor.

As described above, however, it is difficult to supply high-frequency current from the high-capacitance bypass capacitor to the device under test. Therefore, even when measuring the current flowing through the power supply line between the high-capacitance bypass capacitor and the device under test, it is difficult to accurately measure the current consumed by the device under test operating at a high frequency.

SUMMARY

Therefore, it is an object of an aspect of the innovations herein to provide a test apparatus, an additional circuit, and a test board, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a power supply that generates power supplied to the device under test; a transmission path that transmits the power generated by the power supply to the device under test; an intermediate capacitor that is provided between the transmission path and a ground potential; a charge/discharge current measuring section that measures charge/discharge current of the intermediate capacitor; and a load current calculating section that calculates a load current flowing through the device under test, based on the current measured by the charge/discharge current measuring section.

According to a second aspect related to the innovations herein, one exemplary additional circuit may include an additional circuit that is used in a test apparatus for testing a device under test. Here, the test apparatus includes a power supply that generates power supplied to the device under test; a transmission path that transmits the power generated by the power supply to the device under test; and a load current calculating section that calculates a load current flowing through the device under test. Furthermore, the additional circuit comprises an intermediate capacitor that is connected between the transmission path and a ground potential; and a charge/discharge current measuring section that measures charge/discharge current of the intermediate capacitor and notifies the load current calculating section concerning the measurement result.

According to a third aspect related to the innovations herein, one exemplary test board may include a test board that is used in a test apparatus for testing a device under test, comprising a transmission path that transmits power generated by a power supply, which is provided in the test apparatus, to the device under test; an intermediate capacitor provided between the transmission path and a ground potential; and a charge/discharge current measuring section that measures charge/discharge current of the intermediate capacitor and notifies a load current calculating section provided in the test apparatus concerning the measured charge/discharge current.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
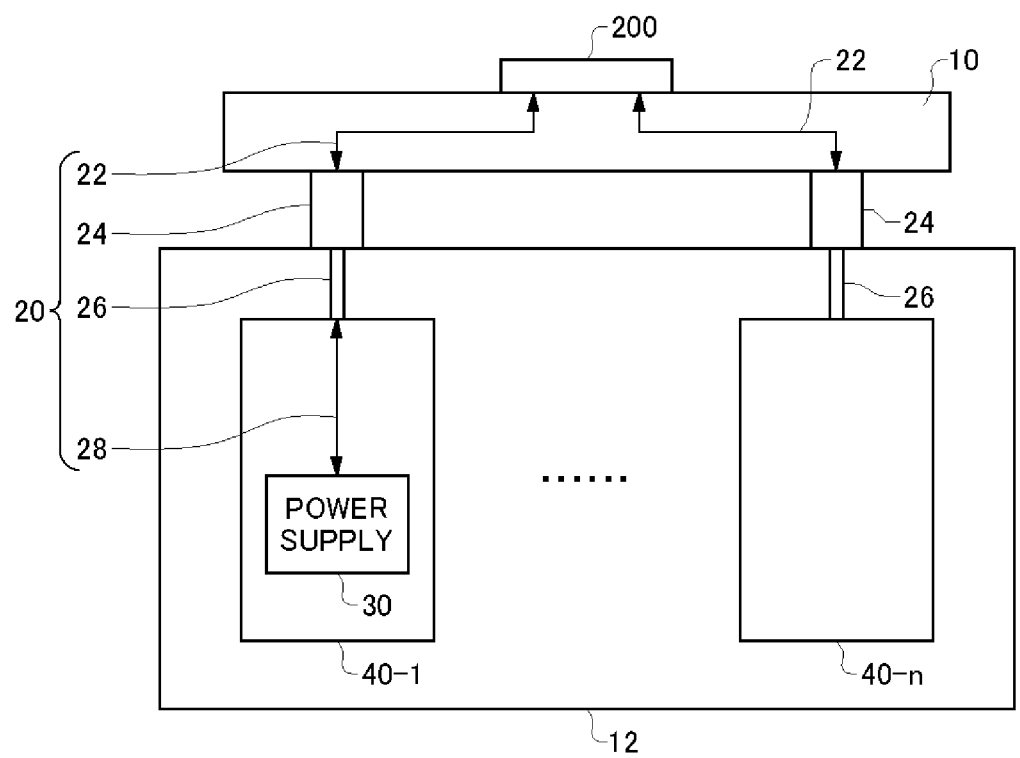
FIG. 1 shows a configuration of a test apparatus 100 according to an embodiment of the present invention, along with a device under test 200.

FIG. 1 shows a configuration of a test apparatus 100 according to an embodiment of the present invention, along with a device under test 200. The test apparatus 100 tests the device under test 200, which may be a semiconductor circuit, and includes a test board 10 and a test head 12.

The test board 10 electrically connects the device under test 200 to the test head 12. For example, the test board 10 may include a socket on which the device under test 200 is mounted to be electrically connected thereto and wiring that electrically connects the socket to the test head 12. Instead, the test board 10 may include a probe pin that contacts a terminal of the device under test 200 and wiring that electrically connects the probe pin to the test head 12.

The test head 12 generates a test signal and supply power or the like, and supplies the generated signals etc. to the device under test 200 via the test board 10. The test head 12 judges acceptability of the device under test 200 by measuring a prescribed characteristic of the device under test 200 when the test signal or the like is supplied thereto. For example, the test head 12 may measure a data pattern of a signal output by the device under test 200 or power consumed by the device under test 200.

The test head 12 of the present embodiment includes a plurality of test modules 40. Each test module 40 is electrically connected to the test board 10 via the connector 24. Each test module 40 may have a different function. For example, the test head 12 may include a test module 40 used to supply power, a test module 40 used for analog signals, and a test module 40 used for digital signals.

In the present embodiment, the test module 40-1 includes a power supply 30 for supplying power to the device under test 200. The power supply 30 is electrically connected to the device under test 200 via the transmission path 20.

The transmission path 20 transmits the power generated by the power supply 30 to the device under test 200. The transmission path 20 may include module wiring 28, a cable 26, a connector 24, and board wiring 22. The module wiring 28 is formed within the test module 40. The cable 26 connects the test module 40 to the connector 24. The board wiring 22 is formed on the test board 10.

The test apparatus 100 of the present invention measures the current consumed by the device under test 200 by measuring the current flowing through the transmission path 20. The test module 40-1 may judge the acceptability of the device under test 200 based on the result of the measurement of the current flowing through the transmission path 20.

Figure 2:
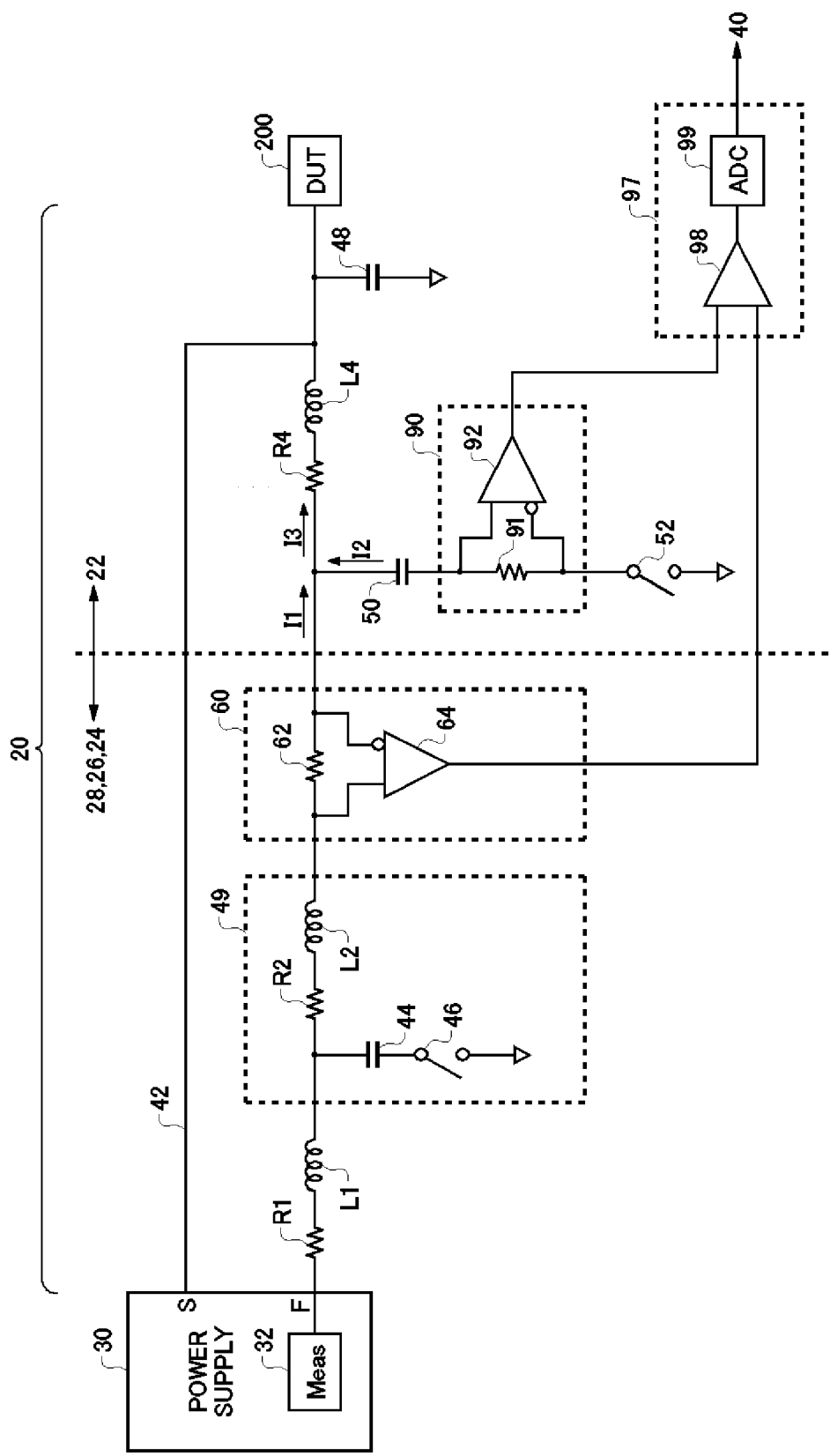
FIG. 2 shows an exemplary configuration of a circuit for measuring the current flowing through the transmission path 20.

FIG. 2 shows an exemplary configuration of a circuit for measuring the current flowing through the transmission path 20. As described above, the power supply 30 is connected to the device under test 200 via the transmission path 20. The power supply 30 may include a low current measuring section 32 that measures a low current, such as the standby current of the device under test 200. The low current measuring section 32 may measure the current output by the power supply 30.

The current measuring section 100 includes a mid-speed current supply section 49, an intermediate capacitor 50, a charge/discharge current measuring section 90, a switch 52, a low-capacitance capacitor 48, a power supply current measuring section 60, and a load current calculating section 97. In FIG. 2, R1, R2, R4, L1, L2, and L4 represent resistance components and inductance components of the transmission path 20.

The mid-speed current supply section 49 includes a high-capacitance capacitor 44, a switch 46, the resistance component R2, and the inductance component L2. The high-capacitance capacitor 44 is connected between the transmission path 20 and a ground potential, at a position closer to the power supply 30 than the intermediate capacitor 50. The high-capacitance capacitor 44 of the present embodiment is provided between the ground potential and a position on the transmission path 20 closer to the power supply 30 than the connector 24, e.g. a position of the module wiring 28. The capacitance of the high-capacitance capacitor 44 may be greater than a maximum load capacitance allowed for the low current measuring section 32. This maximum load capacitance may be a specification value of the low current measuring section 32.

The switch 46 switches whether the high-capacitance capacitor 44 is connected between the module wiring 28 and the ground potential. The switch 46 may be a lead relay.

The low-capacitance capacitor 48 is positioned between the ground potential and the transmission path 20 at a position closer to the device under test 200 than the intermediate capacitor 50. The low-capacitance capacitor 48 of the present embodiment is provided on the test board 10 between the board wiring 22 and the ground potential. The capacitance of the low-capacitance capacitor 48 is less than the capacitance of the high-capacitance capacitor 44. The capacitance of the low-capacitance capacitor 48 may be less than the maximum load capacitance allowed for the low current measuring section 32.

The intermediate capacitor 50 is provided between the ground potential and the transmission path 20 at a position between the high-capacitance capacitor 44 and the low-capacitance capacitor 48. The intermediate capacitor 50 is preferably connected to the transmission path 20 such that the distance between the intermediate capacitor 50 and the low-capacitance capacitor 48 is less than the distance between the intermediate capacitor 50 and the high-capacitance capacitor 44.

More specifically, the intermediate capacitor 50 is preferably positioned in a manner such that the inductance component L4, which is the inductance of the transmission path 20 between the intermediate capacitor 50 and the low-capacitance capacitor 48, is sufficiently less than the inductance component L2, which is the inductance of the transmission path 20 between the intermediate capacitor 50 and the high-capacitance capacitor 44. The intermediate capacitor 50 of the present embodiment is connected to the board wiring 22 of the test board 10 between the low-capacitance capacitor 48 and the connector 24.

By providing the intermediate capacitor 50 closer to the device under test 200 than the cable 26 and the connector 24, the inductance component L4 can be made sufficiently lower than the inductance component L2. As a result, the charge/discharge current of the intermediate capacitor 50 can follow a fluctuation in the current consumed by the device under test 200 relatively quickly.

The capacitance of the intermediate capacitor 50 may be greater than the capacitance of the low-capacitance capacitor 48 and less than the capacitance of the high-capacitance capacitor 44. The capacitance of the low-capacitance capacitor 48 may be approximately 1 µF and the capacitance of the intermediate capacitor 50 may be approximately 10 µF. The capacitance of the intermediate capacitor 50 may be greater than the maximum load capacitance allowed for the low current measuring section 32.

The switch 52 switches whether the intermediate capacitor 50 is connected between the module wiring 28 and the ground potential. The switch 52 may be smaller than the switch 46. For example, the switch 52 may be a semiconductor switch. When using the low current measuring section 32 to measure a low current such as the standby current of the device under test 200, the switch 46 and the switch 52 may disconnect the high-capacitance capacitor 44 and the intermediate capacitor 50 from between the transmission path 20 and the ground potential.

The power supply current measuring section 60 measures the current I1 flowing through the transmission path 20 in a region on the power supply 30 side of the intermediate capacitor 50. For example, the power supply current measuring section 60 may measure the current I1 flowing through the transmission path 20 between the high-capacitance capacitor 44 and the connector 24. The power supply current measuring section 60 may be provided in the test module 40.

The power supply current measuring section 60 of the present embodiment includes a first detection resistor 62 and a differential circuit 64. The first detection resistor 62 is provided on the transmission path 20 at a position closer to the power supply 30 than the connector 24, and causes a voltage drop corresponding to the current value flowing through the transmission path 20. The first detection resistor 62 may be provided on the module wiring 28, for example.

The differential circuit 64 functions as a first potential difference detecting section that detects a potential difference between the ends of the first detection resistor 62. The current I1 flowing through the first detection resistor 62 can be measured by multiplying the potential difference by the resistance value of the first detection resistor 62.

The configuration of the power supply current measuring section 60 is not limited to the example shown in FIG. 2. As another example, the power supply current measuring section 60 may include a current probe instead of the first detection resistor 62 and the differential circuit 64. The current probe may detect the current flowing through the transmission path 20 by converting the magnetic field caused by the current flowing through the transmission path 20 into voltage.

The charge/discharge current measuring section 90 measures the charge/discharge current I2 of the intermediate capacitor 50. The charge/discharge current measuring section 90 of the present embodiment includes a second detection resistor 91 and a differential circuit 92. The second detection resistor 91 is provided between the intermediate capacitor 50 and the switch 52, and causes a voltage drop corresponding to the charge/discharge current I2 of the intermediate capacitor 50.

The differential circuit 92 functions as a second potential difference detecting section that detects a potential difference between the ends of the second detection resistor 91. The current I2 flowing through the second detection resistor 91 can be measured by multiplying the potential difference by the resistance value of the second detection resistor 91.

The load current calculating section 97 calculates a load current I3 flowing through the device under test 200 based on the current I2 measured by the charge/discharge current measuring section 90. As described above, the intermediate capacitor 50 tracks fluctuation of the load current I3 more quickly than the power supply 30. Therefore, the current I2 includes a higher-frequency current component than the current I1. The load current calculating section 97 may calculate the current component that is higher than that of the current I1 within the load current I3 by measuring the current I2.

Instead, the load current calculating section 97 may calculate the load current I3 flowing through the device under test 200 based on the sum of the current I1 measured by the power supply current measuring section 60 and the current I2 measured by the charge/discharge current measuring section 90. As a result, the load current calculating section 97 can calculate a load current I3 that includes both a low-frequency component and a high-frequency component. The present example describes a case in which the load current calculating section 97 calculates the sum of the current I2 and the current I1. The load current calculating section 97 includes an operational amplifier 98 and an AD converter 99. The operational amplifier 98 outputs a voltage corresponding to the sum of the current I1 and the current I2. The AD converter 99 converts the output voltage value of the operational amplifier 98 into a digital value.

As shown in FIG. 2, when the low-capacitance capacitor 48 is connected to the transmission path 20 between the device under test 200 and the intermediate capacitor 50, the load current calculating section 97 calculates the current flowing through the device under test 200 and the low-capacitance capacitor 48 based on the current I1 and the current I2. Since the time during which the charge/discharge current of the low-capacitance capacitor 48 flows is relatively short, the load current calculating section 97 may set the current flowing through the device under test 200 to be the sum of the current I1 and the current I2. Furthermore, the low-capacitance capacitor 48 may be a capacitor within the device under test 200.

As described above, by providing the intermediate capacitor 50 near the device under test 200 and calculating the sum of the charge/discharge current I2 of the intermediate capacitor 50 and the power supply current I1, the current consumed by the device under test 200 can be accurately measured. In other words, even when the power supply current I1 cannot quickly follow the fluctuation of the current consumed by the device under test 200, the charge/discharge current I2 that changes quickly is measured, thereby enabling accurate measurement of the current consumed by the device under test 200.

The power supply current measuring section 60 can be provided closer to the power supply 30 than the intermediate capacitor 50, and therefore the circuit design is simpler than a circuit design in which the power supply current measuring section 60 is provided on the test board 10. Instead of the power supply current measuring section 60, a measurement circuit housed in the power supply 30, such as the low current measuring section 32, can be used to measure the power supply current I1.

By using a semiconductor switch for the switch 52, the switch 52 can be easily provided to the test board 10, which has structural limitations such as the height of elements therein. Therefore, even when the test board 10 is provided with an intermediate capacitor 50 with a relatively high capacitance, the switch 52 can be provided to control whether the intermediate capacitor 50 is connected to the transmission path 20.

The power supply 30 may detect, via the detection line 42, the load current applied to the device under test 200. The power supply 30 controls the output voltage such that the detected load voltage remains at a prescribed amount. The detection line 42 may detect the voltage in the transmission path 20 on the device under test 200 side of the power supply current measuring section 60.

Figure 3:
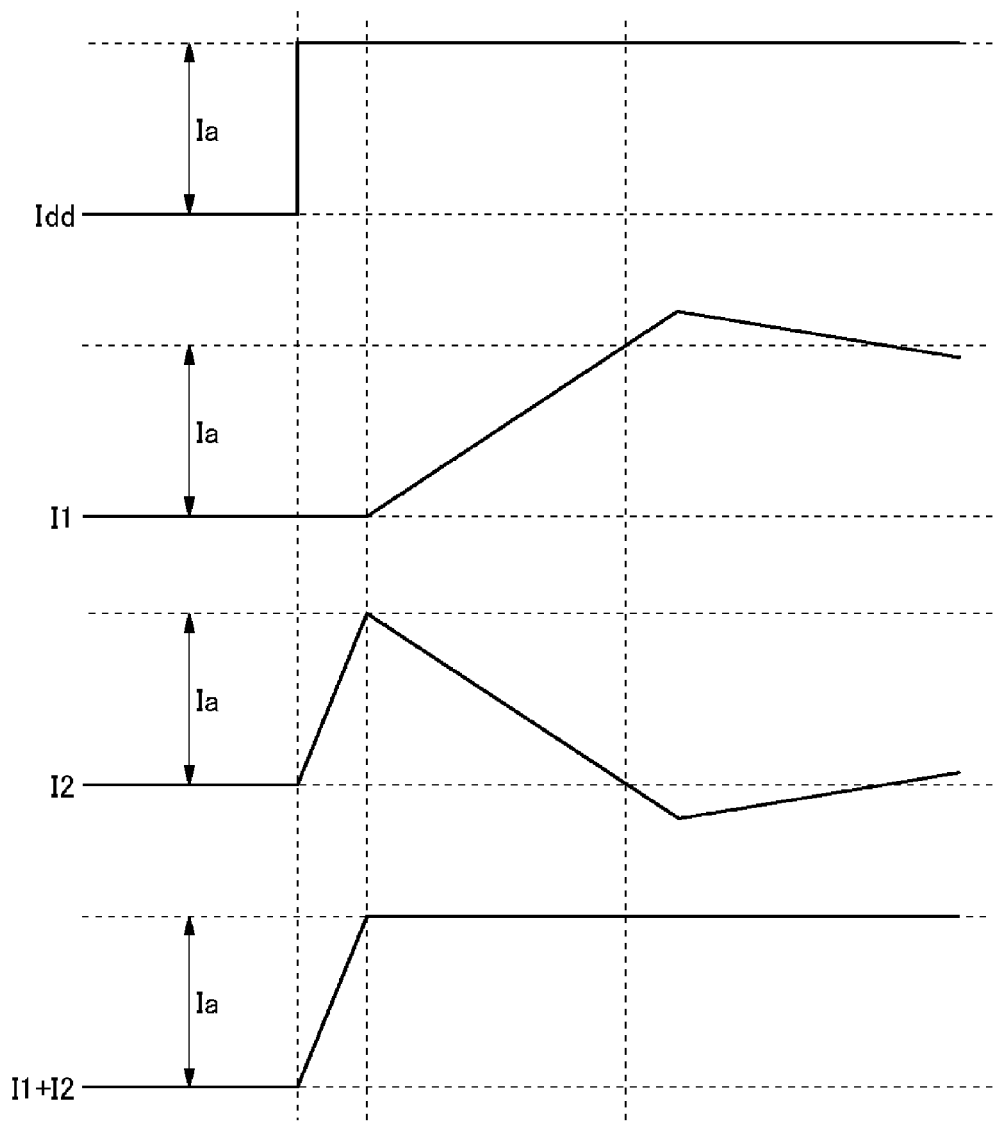
FIG. 3 shows an exemplary current I1 measured by the power supply current measuring section 60 and an exemplary current I2 measured by the charge/discharge current measuring section 90.

FIG. 3 shows an exemplary current I1 measured by the power supply current measuring section 60 and an exemplary current I2 measured by the charge/discharge current measuring section 90. In FIG. 3, the horizontal axis represents time and the vertical axis represents level. Furthermore, Idd in FIG. 3 represents the current consumed by the device under test 200.

As shown in FIG. 3, when the consumed current Idd of the device under test 200 changes suddenly, the power supply current I1 from the power supply 30 and the high-capacitance capacitor 44 cannot quickly follow this change. On the other hand, the charge/discharge current I2 from the intermediate capacitor 50 follows the consumed current Idd relatively quickly. Therefore, as shown in FIG. 3, the consumed current Idd of the device under test 200 can be accurately measured by calculating the sum of the power supply current I1 and the charge/discharge current I2.

In the circuit described in relation to FIG. 2, the first detection resistor 62 and the second detection resistor 91 are additionally provided to detect the current. Therefore, the fluctuation of the power supply voltage applied to the device under test 200 when the consumed current of the device under test 200 fluctuates increases according to the resistance values of the first detection resistor 62 and the second detection resistor 91.

The resistance value of the first detection resistor 62 is set as R1, the resistance value of the second detection resistor 91 is set as R2, and the maximum fluctuation amount of the consumed current Idd is set as I1. In this case, the maximum fluctuation ΔVmax in the power supply voltage applied to the device under test 200 due to the inclusion of the first detection resistor 62 and the second detection resistor 91 is Ia×(R1+R2).

The first detection resistor 62 and the second detection resistor 91 preferably have resistance values according to the allowable fluctuation amount for the power supply voltage applied to the device under test 200. For example, when the maximum fluctuation amount of the consumed current is 100 mA and the allowable value for the power supply fluctuation is 20 mV, the sum of the resistance values of the first detection resistor 62 and the second detection resistor 91 is set to be no greater than 200 mΩ (20 mV/100 mA) according to the above expression.

The current path of the power supply current I1 is an LCR series resonant circuit. Therefore, if the damping resistance of the series resonant circuit is not sufficiently smaller than the resistance component of the current path, charge/discharge current with large vibration occurs. This causes the measurement result of the power supply current I1 to include a charge/discharge current flowing to the intermediate capacitor 50 due to series resonance. To prevent this, the circuit shown in FIG. 2 measures the sum of the power supply current I1 and the charge/discharge current I2. Since the power supply current I1 and the charge/discharge current I2 each include the effect of the charge/discharge current due to series resonance, the effects of the charge/discharge current due to series resonance cancel each other out.

Figure 4:
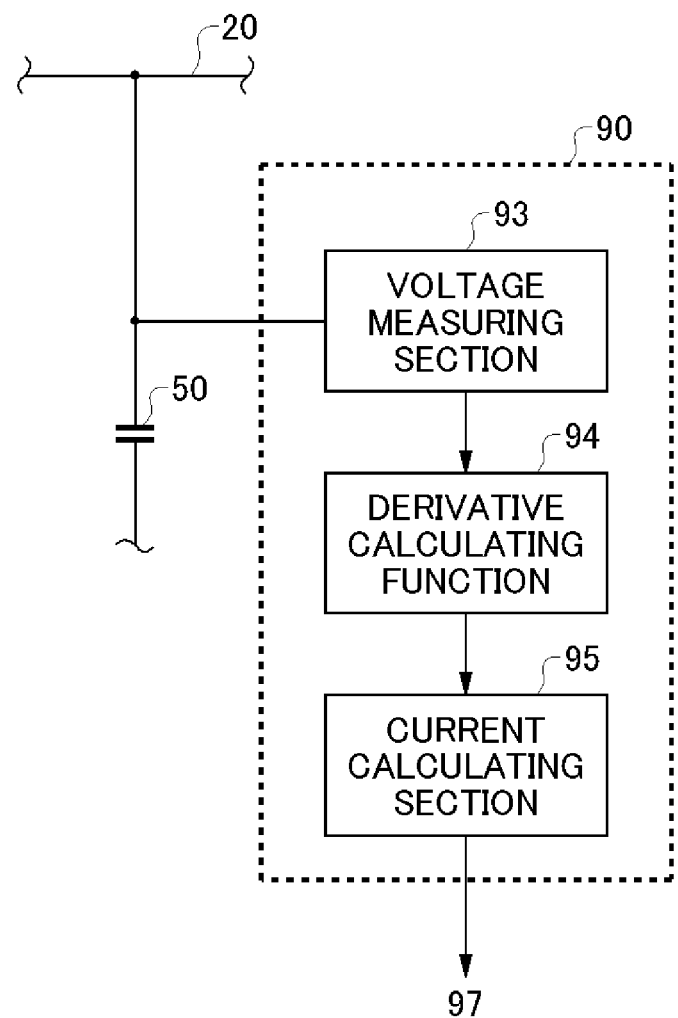
FIG. 4 shows another exemplary configuration of the charge/discharge current measuring section 90.

FIG. 4 shows another exemplary configuration of the charge/discharge current measuring section 90. The charge/discharge current measuring section 90 of the present embodiment includes a voltage measuring section 93, a derivative calculating section 94, and a current calculating section 95. The voltage measuring section 93 measures the voltage of the intermediate capacitor 50. For example, the voltage measuring section 93 may measure a change over time of the voltage at a transmission path 20 side terminal of the intermediate capacitor 50.

The derivative calculating section 94 calculates a derivative value of the voltage measured by the voltage measuring section 93. The current calculating section 95 calculates the charge/discharge current of the intermediate capacitor 50 based on the derivative value calculated by the derivative calculating section 94. The current calculating section 95 may set the current value of the charge/discharge current of the intermediate capacitor 50 to be the derivative value of the voltage measured by the voltage measuring section 93. With this configuration, the charge/discharge current measuring section 90 can measure the charge/discharge current of the intermediate capacitor 50 without using the second detection resistor 91.

Figure 5:
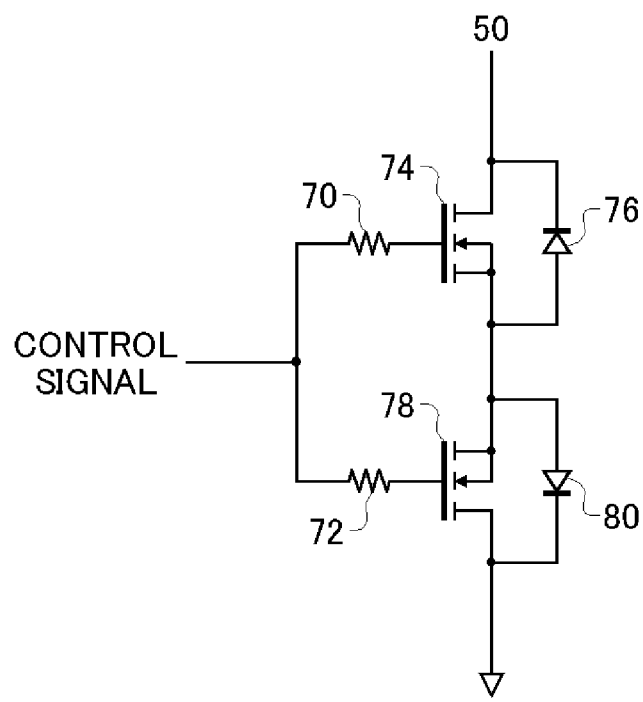
FIG. 5 shows an exemplary configuration of the switch 52.

FIG. 5 shows an exemplary configuration of the switch 52. The switch 52 includes a transistor 74, a transistor 78, a diode 76, a diode 80, a resistor 70, and a resistor 72. The transistor 74 and the transistor 78 are arranged in series between the intermediate capacitor 50 and the ground potential. The transistor 74 and the transistor 78 receive a control signal in parallel via the resistor 70 and the resistor 72. The transistor 74 and the transistor 78 may have the same polarity.

The diode 76 is a parasitic diode that is formed between the source and drain of the transistor 74. The diode 80 is a parasitic diode that is formed between the source and drain of the transistor 78. In the present embodiment, the diode 76 is oriented in a forward direction from the ground potential toward the intermediate capacitor 50, and the diode 80 is oriented in a reverse direction from the intermediate capacitor 50 to the ground potential.

When the control voltage is level H, the intermediate capacitor 50 is connected to the ground potential via the transistor 74 and the transistor 78. When the control voltage is level L, each transistor is OFF and each diode has a reverse connection such that current does not flow, and so the intermediate capacitor 50 is disconnected from the ground potential. With this configuration, the switch 52 can be formed to be small and to have low power consumption.

Figure 6:
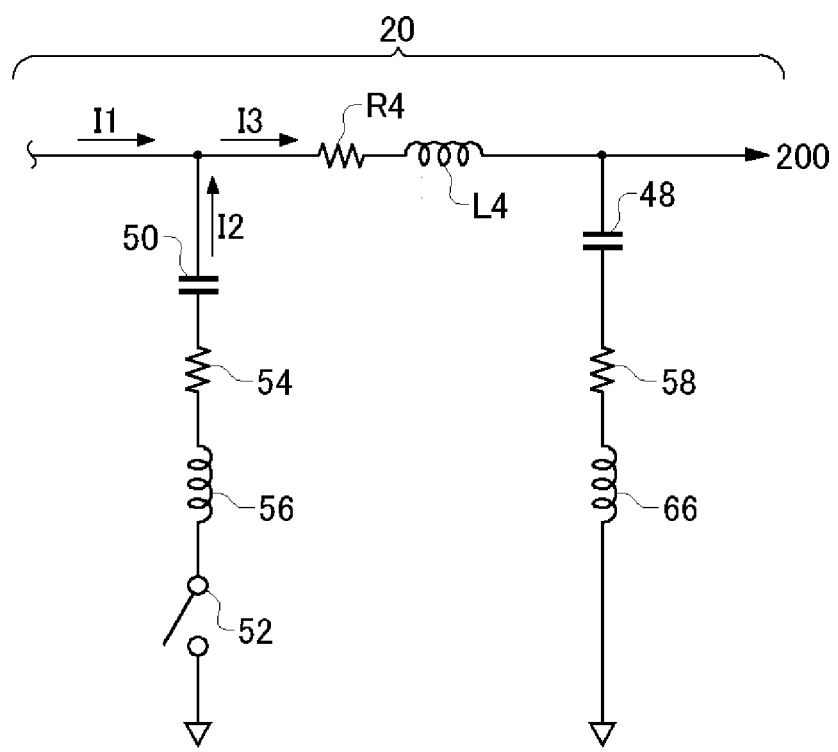
FIG. 6 shows another exemplary configuration of a circuit for measuring the current flowing through the transmission path 20.

FIG. 6 shows another exemplary configuration of a circuit for measuring the current flowing through the transmission path 20. In FIG. 6, only a portion of this circuit is shown. The test apparatus 100 of the present embodiment further includes a damping resistor 54, in addition to the configuration described in FIG. 2. The damping resistor 54 may function as the second detection resistor 91. The inductor 56 represents the inductance component in series with the intermediate capacitor 50 and located between the transmission path 20 and the ground potential. The inductor 66 and the resistor 58 represent the inductance component and the resistance component that are in series with the low-capacitance capacitor 48 and located between the transmission path 20 and the ground potential.

The system that connects the intermediate capacitor 50 to the low-capacitance capacitor 48 is formed by a series resonant circuit. As a result, the current flowing between the intermediate capacitor 50 and the low-capacitance capacitor 48 is resonated. Therefore, the test apparatus 100 of the present embodiment includes the damping resistor 54 to decrease the current resonance.

The damping resistor 54 is connected in series with the intermediate capacitor 50, between the transmission path 20 and the ground potential, and has a resistance value corresponding to the capacitance values of the intermediate capacitor 50 and the low-capacitance capacitor 48. More specifically, the damping resistor 54 is set according to the impedance in the resonance frequency of the composite inductance component L and the composite capacitance component C of the series resonant circuit.

The resonance frequency of this series resonant circuit can be calculated based on the composite inductance component L and the composite capacitance component C of this circuit, using the expression $1/(2\pi \times (LC)^{0.5})$. The resistance value of the damping resistor 54 may be determined according to the impedance of the composite inductance component L and the composite capacitance component C of the resonance frequency. The inductance of the resonance frequency is $(L/C)^{0.5}$. The resistance value of the damping resistor 54 may be set such that the composite resistance value of the series resonant circuit is $2 \times (L/C)^{0.5}$.

Figure 7:
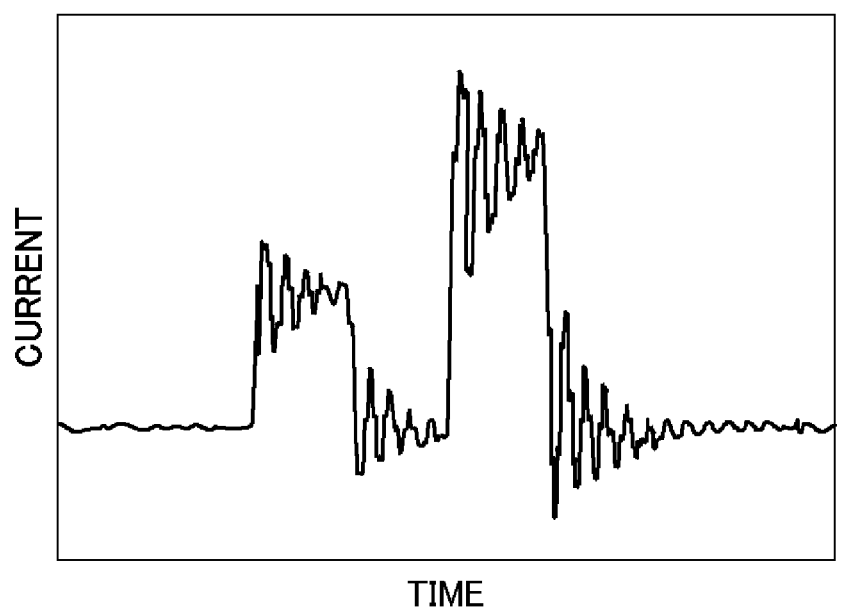
FIG. 7 shows the current flowing through the device under test 200 when the damping resistor 54 has a resistance value approximately equal to that of the resistor 58.

FIG. 7 shows the current flowing through the resistance component R4 in the current path to the device under test 200 when the damping resistor 54 has a resistance value approximately equal to that of the resistor 58. In the present embodiment, the inductance component L4, the inductance of the inductor 56, and the inductance of the inductor 66 are each set to 0.5 nH, the capacitance of the intermediate capacitor 50 is set to 2 µF, the capacitance of the low-capacitance capacitor 48 is set to 0.2 µF, the resistance value of the resistance R4 is set to 2 mΩ, and the resistance values of the damping resistor 54 and the resistor 58 are each set to 5 mΩ. In this case, a large resonance component is included in the current flowing through the intermediate capacitor 50 and the low-capacitance capacitor 48.

Figure 8:
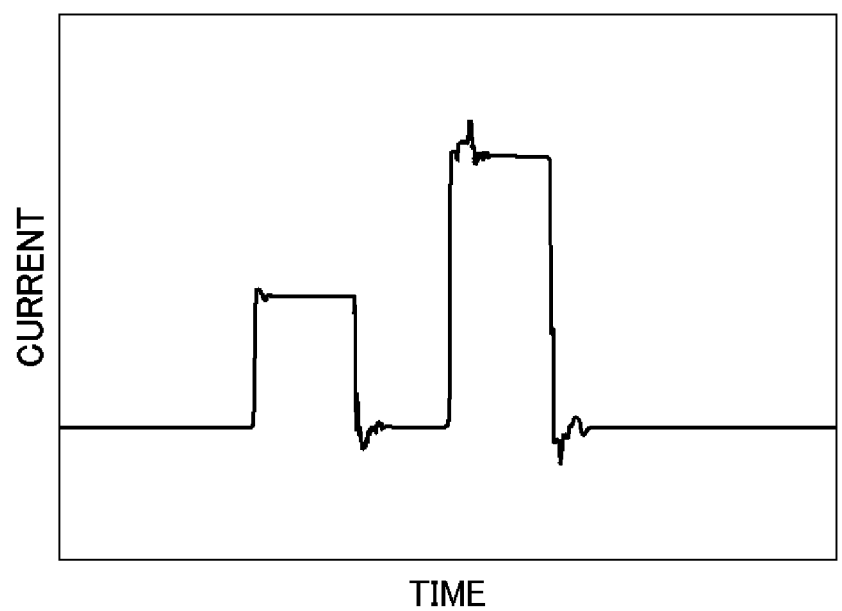
FIG. 8 shows the current flowing through the device under test 200 when the damping resistor 54 has a resistance value that is 20 times greater than that of the resistor 58.

FIG. 8 shows the current flowing through the resistance component R4 in the current path to the device under test 200 when the damping resistor 54 has a resistance value that is 20 times greater than that of the resistor 58. The characteristic values of the elements in the present embodiment are the same as those described in FIG. 7, except that the resistance value of the damping resistor 54 is 85 mΩ. As shown in FIG. 8, the damping resistor 54 can decrease the resonance component of the current flowing through the device under test 200. The damping resistor 54 may have a resistance value greater than that of the resistor 58.

Figure 9:
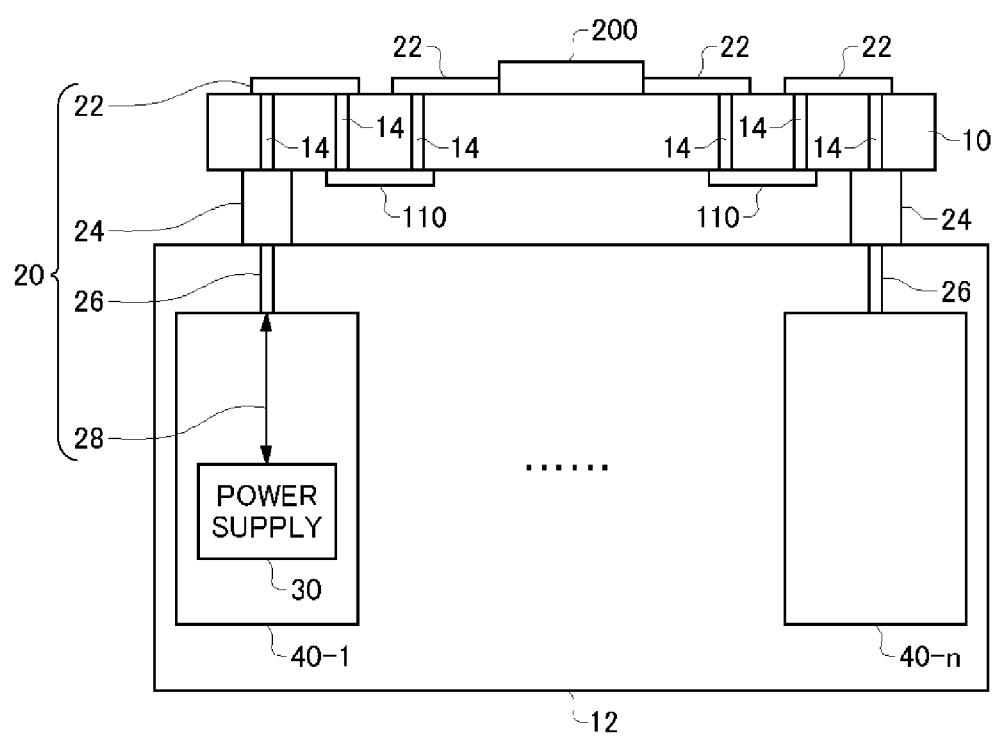
FIG. 9 shows another exemplary configuration of the test apparatus 100.

FIG. 9 shows another exemplary configuration of the test apparatus 100. The test apparatus 100 of the present embodiment further includes an additional circuit 110, in addition to the configuration of the test apparatus 100 described in FIG. 1. The additional circuit 110 includes a portion of the circuit configuration described in relation to FIG. 2, and is fixed on the test board 10.

The additional circuit 110 may be electrically connected to the board wiring 22 of the test board 10. The additional circuit 110 may be fixed to the back side of the surface of the test board 10 on which the device under test 200 is loaded. The additional circuit 110 may be electrically connected to the board wiring 22 on the back side of the test board 10 via the via wiring 14. The via wiring 14 penetrates from the front side to the back side of the test board 10.

The additional circuit 110 may include a portion of the transmission path 20. In this case, the board wiring 22 of the test board 10 and the transmission path 20 of the additional circuit 110 are connected in series. For example, separated portions of the board wiring 22 may be formed on the test board 10 and additional circuits 110 may be used to provide serial connections between the separated portions of the board wiring 22.

Figure 10:
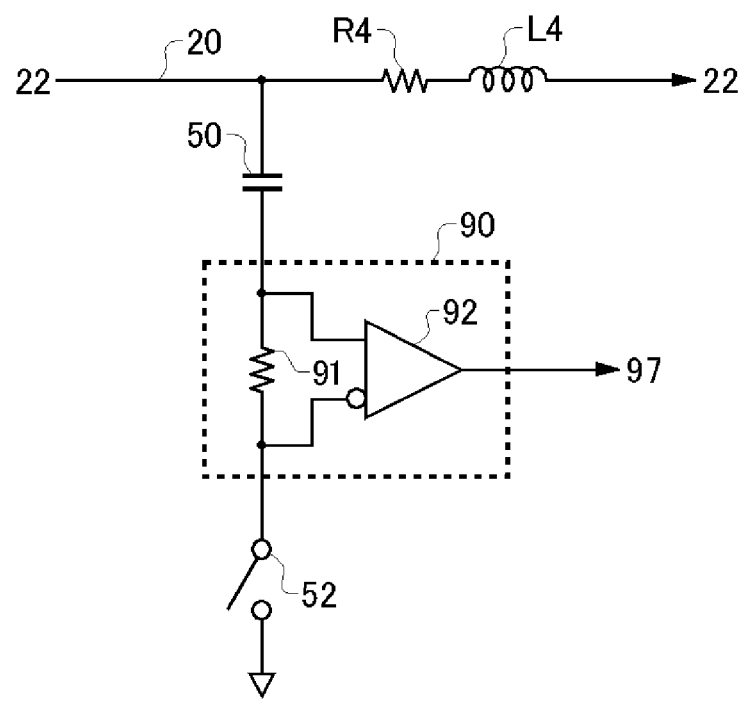
FIG. 10 shows an exemplary configuration of the additional circuit 110.

FIG. 10 shows an exemplary configuration of the additional circuit 110. The additional circuit 110 of the present invention includes a portion of the transmission path 20, an intermediate capacitor 50, a charge/discharge current measuring section 90, and a switch 52. The ends of the transmission path 20 in the additional circuit 110 are electrically connected to the board wiring 22 via the via wiring 14 in a manner to be inserted between the separated portions of the board wiring 22.

The intermediate capacitor 50, the charge/discharge current measuring section 90, and the switch 52 are the same as the intermediate capacitor 50, the charge/discharge current measuring section 90, and the switch 52 described in relation to FIG. 2. The charge/discharge current measuring section 90 notifies the load current calculating section 97 provided in the test module 40 concerning the measured current I2.

By attaching this additional circuit 110 to a test apparatus that does not include the intermediate capacitor 50 or the charge/discharge current measuring section 90, this test apparatus can function as the test apparatus 100 described in relation to FIGS. 1 to 10. The additional circuit 110 can be easily mounted by separating the board wiring 22 and electrically inserting the additional circuit 110 between the separated portions of the board wiring 22, as described above.

The configuration of the additional circuit 110 is not limited to the configuration shown in FIG. 10. The additional circuit 110 may further include one or more of the configurational elements shown in FIG. 2. More specifically, the additional circuit 110 may include one or more of the power supply current measuring section 60, the mid-speed current supply section 49, and the low-capacitance capacitor 48.

The test board 10 may have the circuit configuration described in FIG. 10. For example, the test board 10 may include a portion of the transmission path 20, the intermediate capacitor 50, the charge/discharge current measuring section 90, and the switch 52. More specifically, the test board 10 may include one or more of the power supply current measuring section 60, the mid-speed current supply section 49, and the low-capacitance capacitor 48.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
   a power supply that generates power supplied to the device under test;
   a transmission path that transmits the power generated by the power supply to the device under test;
   an intermediate capacitor that is provided between the transmission path and a ground potential;
   a charge/discharge current measuring section that measures a charge/discharge current of the intermediate capacitor; and
   a load current calculating section that calculates a load current flowing through the device under test, based on the charge/discharge current.

2. The test apparatus according to claim 1, further comprising a power supply current measuring section that measures a power supply current flowing though the transmission path on a power supply side of the intermediate capacitor, wherein the load current calculating section calculates the load current based on a sum of the power supply current and the charge/discharge current.

3. The test apparatus according to claim 2, further comprising a high-capacitance capacitor that has a higher capacitance than the intermediate capacitor and that is provided between the ground potential and the transmission path at a position closer to the power supply than the intermediate capacitor.

4. The test apparatus according to claim 3, further comprising a low-capacitance capacitor that has a lower capacitance than the intermediate capacitor and that is provided between the ground potential and the transmission path at a position closer to the device under test than the intermediate capacitor.

5. The test apparatus according, to claim 4, wherein the load current calculating section calculates a current flowing through the device under test and the low-capacitance capacitor based on the sum of the power supply current and the charge/discharge current.

6. The test apparatus according to claim 4, wherein the intermediate capacitor is connected to the transmission path closer to the low-capacitance capacitor than the high-capacitance capacitor.

7. The test apparatus according to claim 6, further comprising a test board that contacts the device under test, wherein the low-capacitance capacitor and the intermediate capacitor are provided on the test board.

8. The test apparatus according to claim 7, further comprising a connector that is provided on the transmission path and that electrically connects the test board to the power supply, wherein the high-capacitance capacitor is connected to the transmission path on the power supply side of the connector.

9. The test apparatus according to claim 8, wherein the power supply current measuring section measures a current flowing through the transmission path between the connector and the high-capacitance capacitor.

10. The test apparatus according to claim 9,
    wherein the power supply current measuring section includes a first detection resistor that is provided on the transmission path on the power supply side of the connector, and a first potential difference detecting section that detects a potential difference between ends of the first detection resistor; and
    wherein the charge/discharge current measuring section includes a second detection resistor that is provided between the intermediate capacitor and the ground potential, and a second potential difference detecting section that detects a potential difference between ends of the second detection resistor.

11. The test apparatus according to claim 8,
    wherein the power supply current measuring section includes a first detection resistor that is provided on the transmission path on the power supply side of the connector, and a first potential difference detecting section that detects a potential difference between ends of the first detection resistor; and
    wherein the charge/discharge current measuring section includes a voltage measuring section that measures voltage of the intermediate capacitor, a derivative calculating section that calculates a derivative value of the voltage measured by the voltage measuring section, and a current calculating section that calculates the charge/discharge current of the intermediate capacitor based on the derivative value calculated by the derivative calculating section.

12. The test apparatus according to claim 4, further comprising a damping resistor that is provided in series with the intermediate capacitor between the transmission path and the ground potential and that has a resistance value corresponding to a capacitance value of each of the intermediate capacitor and the low-capacitance capacitor.

13. An additional circuit that is used in a test apparatus for testing a device under test, the test apparatus including a power supply that generates power supplied to the device under test, a transmission path that transmits the power generated by the power supply to the device under test, and a load current calculating section that calculates a load current flowing through the device under test, the additional circuit comprising:
    an intermediate capacitor that is connected between the transmission path and a ground potential; and
    a charge/discharge current measuring section that measures charge/discharge current of the intermediate capacitor and notifies the load current calculating section concerning the measurement result.

14. The additional circuit according to claim 13, wherein the test apparatus further includes a test board on which the transmission path is formed, and the intermediate capacitor is fixed to the test board.

15. The additional circuit according to claim 13, further comprising a power supply current measuring section that measures a power supply current flowing through the transmission path on the power supply side of the intermediate capacitor and notifies the load current calculating section concerning the power supply current.

16. A test board that is used in a test apparatus for testing device under test, comprising:
    a transmission path that transmits power generated by a power supply to the device under test;
    an intermediate capacitor provided between the transmission path and a ground potential; and
    a charge/discharge current measuring section that measures a charge/discharge current of the intermediate capacitor, and notifies a load current calculating section concerning the charge/discharge current.

17. The test board of claim 16, further comprising a power supply current measuring section that measures a power supply current flowing through the transmission path on the power supply side of the intermediate capacitor, and notifies the load current calculating section concerning the power supply current.

* * * * *